United States Patent
Fukuma

(10) Patent No.: US 9,270,243 B2
(45) Date of Patent: Feb. 23, 2016

(54) VOLUME CONTROL SYSTEM, CONTROLLER PROGRAM OF THE VOLUME CONTROL SYSTEM, AND AUDIO OUTPUT DEVICE OF THE VOLUME CONTROL SYSTEM

(71) Applicant: Onkyo Corporation, Osaka (JP)

(72) Inventor: Hiroyuki Fukuma, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 367 days.

(21) Appl. No.: 13/675,167

(22) Filed: Nov. 13, 2012

(65) Prior Publication Data

US 2013/0148825 A1  Jun. 13, 2013

(30) Foreign Application Priority Data

Dec. 12, 2011  (JP) .................................. 2011-271071

(51) Int. Cl.
  *H03G 3/00* (2006.01)
  *H03G 9/00* (2006.01)
  *H03G 3/20* (2006.01)
  *H03G 3/10* (2006.01)
  *H03G 3/30* (2006.01)

(52) U.S. Cl.
  CPC . *H03G 3/20* (2013.01); *H03G 3/10* (2013.01); *H03G 3/3005* (2013.01)

(58) Field of Classification Search
  CPC ........... H03G 3/001; H03G 3/10; H03G 3/20; H03G 3/3005
  USPC .................... 381/80, 102, 104, 105, 107, 109
  See application file for complete search history.

(56) References Cited

U.S. PATENT DOCUMENTS

| 2011/0002471 | A1* | 1/2011 | Wihardja et al. ................ 381/56 |
| 2011/0142259 | A1 | 6/2011 | Kashi | |
| 2012/0051560 | A1* | 3/2012 | Sanders ........................ 381/105 |
| 2012/0057725 | A1* | 3/2012 | Nakamura .................... 381/104 |
| 2012/0209933 | A1* | 8/2012 | Ridges et al. ................. 709/208 |

FOREIGN PATENT DOCUMENTS

JP  2011-142601  7/2011

* cited by examiner

*Primary Examiner* — Vivian Chin
*Assistant Examiner* — William A Jerez Lora
(74) *Attorney, Agent, or Firm* — Renner, Otto, Boisselle & Sklar, LLP

(57) ABSTRACT

A volume control system, that can easily check current volume values with respect to volume values settable in a plurality of audio output devices when a volume value representing the volume values of the audio output devices is displayed, is provided. A controller of the volume control system can be connected to the plurality of the audio output devices, and can control the audio output devices. The controller obtains the volume values of the audio output devices and predetermined upper limit volume values stored in the audio output devices, and displays percentages of the volume values with respect to the predetermined upper limit volume values as total volume values. Further, the controller displays values that are determined by multiplying the total volume values and percentages of the predetermined upper limit volume values with respect to prescribed values as the volume values of the audio output devices.

7 Claims, 14 Drawing Sheets

Fig. 5

| No | Client identifier | IP Address | V(n) | V(n)Max | I(n) | I(n)Max | Timestamp |
|---|---|---|---|---|---|---|---|
| 1 | MAC 1(200A) | 192.168.9.121 | V(1)=40 | V(1)Max=90 | I(1)=30 | I(1)Max=90 | 2011/12/1/12:00 |
| 2 | MAC 2(200B) | 192.168.9.131 | V(2)=50 | V(2)Max=100 | I(2)=20 | I(2)Max=100 | 2011/12/1/11:00 |
| 3 | MAC 3(200C) | 192.168.9.141 | V(3)=80 | V(3)Max=80 | I(3)=40 | I(3)Max=80 | 2011/12/1/9:00 |
| 4 | MAC 4(200D) | 192.168.9.151 | V(4)=30 | V(4)Max=100 | I(4)=30 | I(4)Max=100 | 2011/12/1/8:00 |
| 5 | MAC 5(200E) | 192.168.9.161 | V(5)=100 | V(5)Max=100 | I(5)=90 | I(5)Max=100 | 2011/12/1/3:00 |
| -1 | — | — | — | — | It = 90 | ItMax=100 | — |

Volume management table

Fig. 6

| I | V | Imax | Vmax | Timestamp |
|---|---|------|------|-----------|
| 40 | 90 | 90 | 90 | 2011/12/1/8:00 |

Volume table 201

VOLUME CONTROL SYSTEM, CONTROLLER PROGRAM OF THE VOLUME CONTROL SYSTEM, AND AUDIO OUTPUT DEVICE OF THE VOLUME CONTROL SYSTEM

BACKGROUND OF THE INVENTION

1. Field of the Invention

The present invention relates to a controller in a volume control system and an audio output device that can control a volume via the controller.

2. Description of the Related Art

In recent years, the following reproducing form (hereinafter, referred to as a network reproducing system) is widely used. In this system, a server that saves contents, an audio output device (hereinafter, referred to as a client) and a device (hereinafter, referred to as a controller) for viewing the contents saved in the server and transmitting an instruction for reproducing the contents in the server to the client are connected to a network. When the controller is operated, the contents in the server is reproduced by the client.

In the network reproducing system, a plurality of clients is connected to the network, and the contents in the server can be reproduced from the plurality of clients by control from the controller. When the clients are audio output devices such as AV amplifiers, volumes of the respective clients can be controlled by the controller. Conventionally, the controller controls volume values of the plurality of clients according to the following method. Smallest values settable in the clients and the controller are 0, and largest values are 100.

It is assumed that a client A, a client B and a client C are connected to the network reproducing system. When volume values of the respective clients are 80, 30 and 40, respectively, an average value of the volume values of the clients is such that $(80+30+40) \div 3=50$. The controller obtains the average value of the volumes of the clients, and stores the average value as a total volume. In the controller, when the user changes the total volume into 52, the volumes of the clients are such that $82=(80+2)$, $32=(30+2)$, and $42=(40+2)$, respectively.

However, when the total volume is the average value of the clients, the user cannot understand how the current volume values of the clients are close to the largest volume values settable in the clients even if a user checks the total volume. For example, even when the total volume is 50, the client A has 80% of the largest volume value (100), and the client B has 30%, and thus these values are greatly different from each other. That is to say, the user cannot directly understand positions of the volume values set for the clients with respect to the largest volume values settable in the clients even if the user checks the total volume.

Change characteristics of audio output levels (amplification degree) at a time when the volume values of the clients are different according to the clients. Further, the largest volume values settable in the clients are not always limited to 100. Therefore, when an increase in the total volume is transmitted to the clients according to the above method and when the clients change the volume values, a level of the rises in the volume varies according to the clients. FIG. 14 illustrates change characteristics of the output levels of the clients A and B. In FIG. 14, a horizontal axis represents the volume values visually recognized by the user on a display section, and a vertical axis represents output values (dB). That is to say, the values in the horizontal axis are transmitted from the controller when the total volume is changed. The largest value of the volume of the client A in FIG. 14 is 100, and the largest value of the volume of the client B is 80. When the volume values of the clients A and B are set to 100 and 80, respectively, an audio signal with the maximum output of 20 dB is output. As is clear from FIG. 14, a percentage of rise in the volume value varies according to the clients. Therefore, for example, when the volume value is changed from 40 into 50 by the control of the controller, since a degree of the rise of the output level of the client B ($\delta$B) is larger than a degree of the rise ($\delta$A) of the output level of the client A, the user feels acoustic discomfort. In general, the change characteristics of the output levels in FIG. 14 are expressed by curved lines.

The following problem further arises. When the total volume of the controllers is changed while powers of some of the plurality of clients are being set to off, the clients whose power is off cannot receive an instruction for changing the volume values, and the volume values of the clients whose power is set to off are not reflected in the total volume. Further, when the controller is powered off, the volume values of the clients are controlled and then the controller is powered on, the total volume retained in the controller does not obtain a value in which the volume values of the clients are reflected.

U.S. Pat. No. 7,571,014B1 describes that the volume values of the plurality of clients are controlled from the controller.

However, according to the above technique, the average value of the volume values of the clients is used as a volume of the group. For this reason, when the group volume is controlled, a change rate of the volumes of the clients varies.

Japanese Patent Application Laid-Open No. 2011-142601 describes that a volume value of an audio adjusting device is set based on the control of the controller.

However, according to the above technique, this document does not describe that the volume values of the plurality of clients are changed from the controller according to output levels of the clients.

SUMMARY OF THE INVENTION

The present invention is devised in order to solve the above conventional problems, and its object is to provide a volume control system for checking a representative volume value so as to be capable of easily recognizing volumes set in a plurality of audio output devices when the volume value representing the volume values of the audio output devices is displayed on a controller.

Further, another object of the present invention is to provide a volume control system capable of making control so that change rates of the volumes of the plurality of the audio output devices are constant when the volume values of the audio output devices are changed according to the volume value representing the volume values of the plurality of audio output devices.

It is still another object of the present invention to provide a volume control system in which a controller can normally display volume values of a plurality of audio output devices and a volume value representing the volume values of the audio output devices even when the controller cannot obtain volume changes of the audio output devices or the audio output devices cannot receive an instruction for changing volumes from the controller.

A volume control system according to a preferred embodiment of the present invention comprises: a plurality of audio output devices capable of adjusting volumes; and a controller capable of controlling the audio output devices, wherein the controller has a display section for displaying information about the audio output devices, a first parameter obtaining section for obtaining first parameters as volume values set in the audio output devices from the audio output devices, a second parameter obtaining section for obtaining second parameters as predetermined upper limit volume values stored in the audio output devices from the audio output devices, a management section for relating the first parameters and the second parameters to the audio output devices so as to manage them, a total volume value determining section for determining values determined by ratios of the second parameters to the first parameters of the audio output devices as total volume values, an individual volume value determining section for determining values determined by multiplying the total volume values and percentages of the second parameters to prescribed values as individual volume values of the audio output devices, a total volume value display section for displaying the total volume values on the display section, and an individual display section for displaying the individual volume values of the audio output devices on the display section, each of the audio output devices has a parameter transmitting section for transmitting each of the first parameters and each of the second parameters to the controller, and a volume value storage section for storing each of the first parameters and each of the second parameters with them being related to each other.

The controller of the volume control system can be connected to the plurality of audio output devices and can control the volume values of the audio output devices. The controller obtains the volume values of the audio output devices and predetermined upper limit volume values stored in the audio output devices, and displays percentages of the volume values with respect to the predetermined upper limit volume values as total volume values. Further, the controller displays values that are determined by multiplying the total volume values and the percentages of the predetermined upper limit volume values to defined values, as the volume values of the audio output devices. As a result, the user can understand the percentages of the volume values set in the audio output devices with respect to settable volumes values only by checking the total volume values.

In a preferred embodiment, the controller further has a total volume value changing section for changing the total volume values via a user operation, and a volume control information transmitting section for transmitting information for changing volumes into the individual volume values to the audio output devices, when the total volume values are changed, the individual volume value determining section determines values that are determined by multiplying the changed total volume values and the percentages of the second parameters with respect to the prescribed values as the individual volume values, and the individual display section updates the individual volume values of the audio output devices so as to display them, each of the audio output devices further has, a volume control information receiving section for receiving each of the individual volume values from the controller, and a volume changing section for changing the volume of each of the audio output devices based on each of the received individual volume values.

When the controller changes the total volume values, the volume values of the audio output devices are changed into values calculated by multiplying the changed total volume values and the percentages of the predetermined upper limit volume values with respect to the prescribed values, and the audio output devices are instructed to change the volume values. As a result, even when volume change characteristics of the audio output devices are different, since the change rates of the volumes of the audio output devices at a time of changing the total volume values are constant, acoustic discomfort is not produced.

In an another preferred embodiment, the controller further has a third parameter obtaining section for obtaining third parameters as largest volume values settable in the audio output devices, the total volume value determining section determines the total volume values using percentages of the second parameters with respect to the third parameters instead of the second parameters, the individual volume value determining section determines the individual volume values using the third parameters instead of the prescribed values, in each of the audio output devices the parameter transmitting section transmits each of the first parameters, each of the second parameters and each of the third parameters to the controller, the volume value storage section stores each of the first parameters, each of the second parameters and each of the third parameters with them being related to each other.

Since the total volume values and the individual volume values of the controller are calculated by using largest volume values settable in the audio output devices, even if the largest volume values settable in the audio output devices are different, the total volume values and the individual volume values can be suitably calculated.

In an another preferred embodiment, the controller further has an audio output device volume value changing section for changing the individual volume values, a second parameter updating section for, when the individual volume values are changed, calculating to update the second parameters so that percentages of the changed individual volume values with respect to the second parameters are equal to the total volume values, a determining section for, when the individual volume values are changed, determining whether the changed individual volume values are larger than the total volume values, and a total volume value updating section for, when the determination is made that the changed individual volume values are larger than the total volume values, updating the total volume values to the changed individual volume values, the individual volume value determining section determines the individual volume values of the audio output devices whose individual volume values are not changed, the volume control information transmitting section transmits the individual volume values and the changed second parameters to the audio output devices, in each of the audio output devices, the volume value storage section updates each of the individual volume values transmitted by the volume control information transmitting section as each of the first parameters so as to store the updated value, and updates each of the transmitted second parameters so as to store the updated parameter.

In the controller, when the volume values of the audio output devices are changed, the predetermined upper limit volume values of the audio output devices are changed so that the changed volume values of the audio output devices are equal to the total volume values. As a result, when the volume values of the audio output devices are changed, consistency between the total volumes values and individual volume values of the audio output devices can be maintained. Further, when the predetermined upper limit volume values are changed, the controller transmits the predetermined upper limit volume values to the audio output devices, so that consistency between the predetermined upper limit volume values of the controller and the audio output devices is maintained.

In an another preferred embodiment, the volume control information transmitting section relates the individual volume values and the changed second parameters to time stamps representing current time so as to transmit them to the audio output devices, each of the audio output devices further has an updating section for, when the user operation changes the volume values of the audio output devices, updating each of the first parameters, each of the second parameters and each of the time stamps, the volume value storage section stores the first parameters, the second parameters and the time stamps with them being related to each other, the parameter transmitting section transmits each of the first parameters, each of the second parameters and each of the time stamps to the controller, the controller further has a time stamp obtaining section for obtaining the time stamps, and a total volume value determining section for determining whether all the total volume values determined based on the first parameters and the second parameters obtained from the audio output devices are equal to each other, when all the total volume values are not equal to each other, the total volume value determining section determines the total volume values based on the first parameters and the second parameters with the latest time stamps, and transmits the first parameters, the second parameters and the time stamps determined based on the total volume values to the volume output devices.

When the user changes the volume values, the audio output devices update the volume values and the predetermined upper limit volume values. When the predetermined upper limit volume values obtained by the controller from the audio output devices are different from the total volume values calculated from the volume values set in the audio output devices, latest time stamps managed to be related to the volume values obtained from the audio output devices, respectively, are used. The controller transmits the volume values of the audio output devices calculated from the total volume values and the predetermined upper limit volume values to the audio output devices. As a result, even when the controller cannot understand the volume change in the audio output devices or when the audio output devices cannot receive the instruction for changing the volumes from the controller, the controller can normally display the volume values of the audio output devices and the volume value representing the volume values of the plurality of audio output devices.

The volume control system, in which when the volume value representing the volume values of the plurality of audio output devices is displayed on the controller, the representative volume value is checked so that the volume values set in the audio output devices can be visually recognized easily, can be provided.

The volume control system, in which when the volume values of the plurality of audio output devices are changed according to the volume value representing the volume values of the plurality of audio output devices, a control can be made so that the volume change rates of the audio output devices are constant, can be provided.

The volume control system, in which even when the controller cannot obtain the volume changes in the audio output devices or the audio output devices cannot receive the instruction for changing the volumes from the controller, the controller can normally display the volume values of the audio output devices and the volume value representing the volume values of the plurality of audio output devices, can be provided.

BRIEF DESCRIPTION OF THE DRAWINGS

FIG. 5 is a table of the controller;
FIG. 6 is a table of the client.

DETAILED DESCRIPTION OF THE PREFERRED EMBODIMENTS

A controller, a client and a server according to a preferred embodiment of the present invention will be concretely described below with reference to the drawings, but the present invention is not limited to the embodiment.

Figure 1:
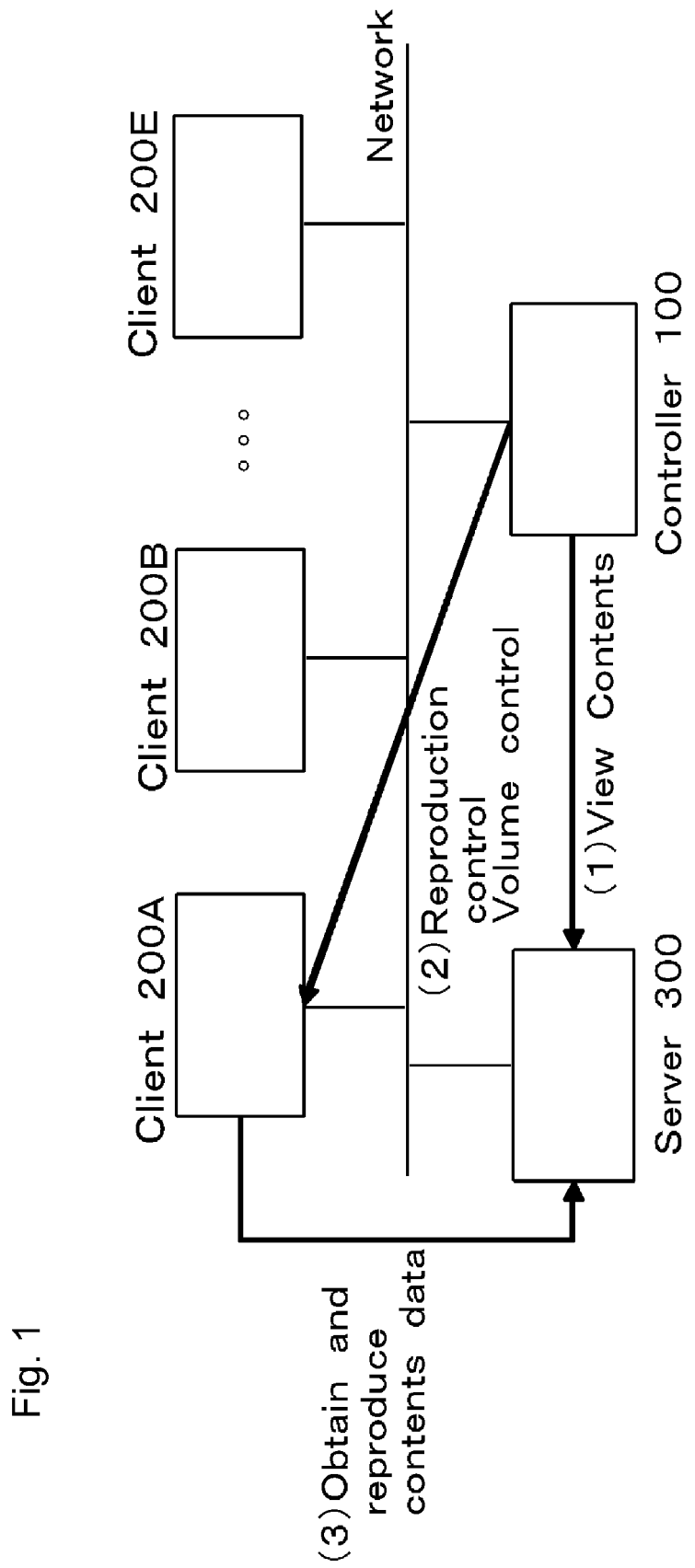
FIG. 1 is a connecting diagram according to a preferred embodiment of the present invention.

FIG. 1 is a connecting diagram illustrating a controller 100, clients 200A, 200B, 200C, 200D and 200E, and a server 300 according to the preferred embodiment of the present invention. When particular discrimination is not necessary, the clients 200A, 200B, 200C, 200D and 200E are simply referred to as the client 200. The controller 100, the client 200 and the server 300 are connected via a network.

The controller 100 is a device for controlling the client 200 and the server 300, and is, for example, a mobile terminal or a PC. The client 200 is an audio output device, and for example, an AV amplifier or a network player. The server 300 is a device having a storage device such as HDD, and for example, NAS (Network Attached Storage) or a PC. The server 300 can store contents (music data and video data), and transmits contents data and a contents list according to requests from the client 200 and the controller 100.

The controller 100 obtains a contents list of the server 300 according to a user's operation ((1) in FIG. 1). The obtained contents list is displayed on a display section of the controller 100. The client 200 that reproduces the contents is selected from the clients 200A to 200E displayed on the controller 100 by a user's operation. A plural number of the clients 200 may be selected. When the controller 100 is instructed to reproduce the contents in the contents list, the controller 100 transmits a reproducing instruction to the client 200 ((2) in FIG. 1). The client 200 requests contents data specified by the controller 100 to the server 300, and reproduces the contents data ((3) in FIG. 1). When the client 200 itself changes a volume according to a user's operation or receives the volume control instruction from the controller 100 via the network ((2) in FIG. 1), the client 200 changes an output level of an audio signal output from the client 200. A plurality of the servers 300 and a plurality of the controllers 100 may be provided. The respective clients 200 may reproduce different contents or same contents in the servers 300.

Figure 2:
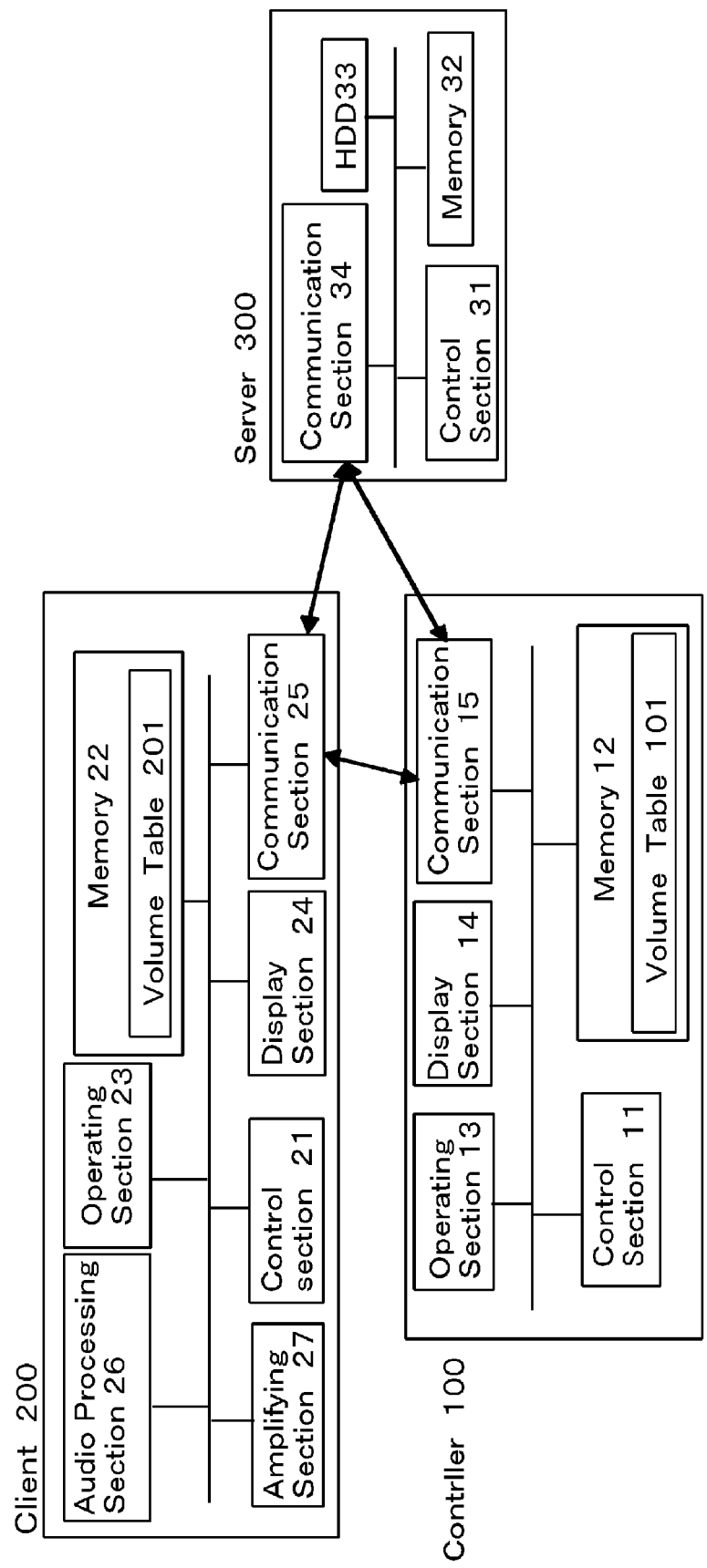
FIG. 2 is a block diagram illustrating a controller, a client and a server.

FIG. 2 is a block diagram illustrating the controller 100, the client 200 and the server 300. A control section 11 of the controller 100 executes a program stored in the memory 12 to control the controller 100 entirely, and is for example, a microcomputer or a CPU. The memory 12 retains setting contents of the controller 100, and is for example, a ROM or a RAM. The memory 12 has a volume management table 101, described later.

Figure 3:
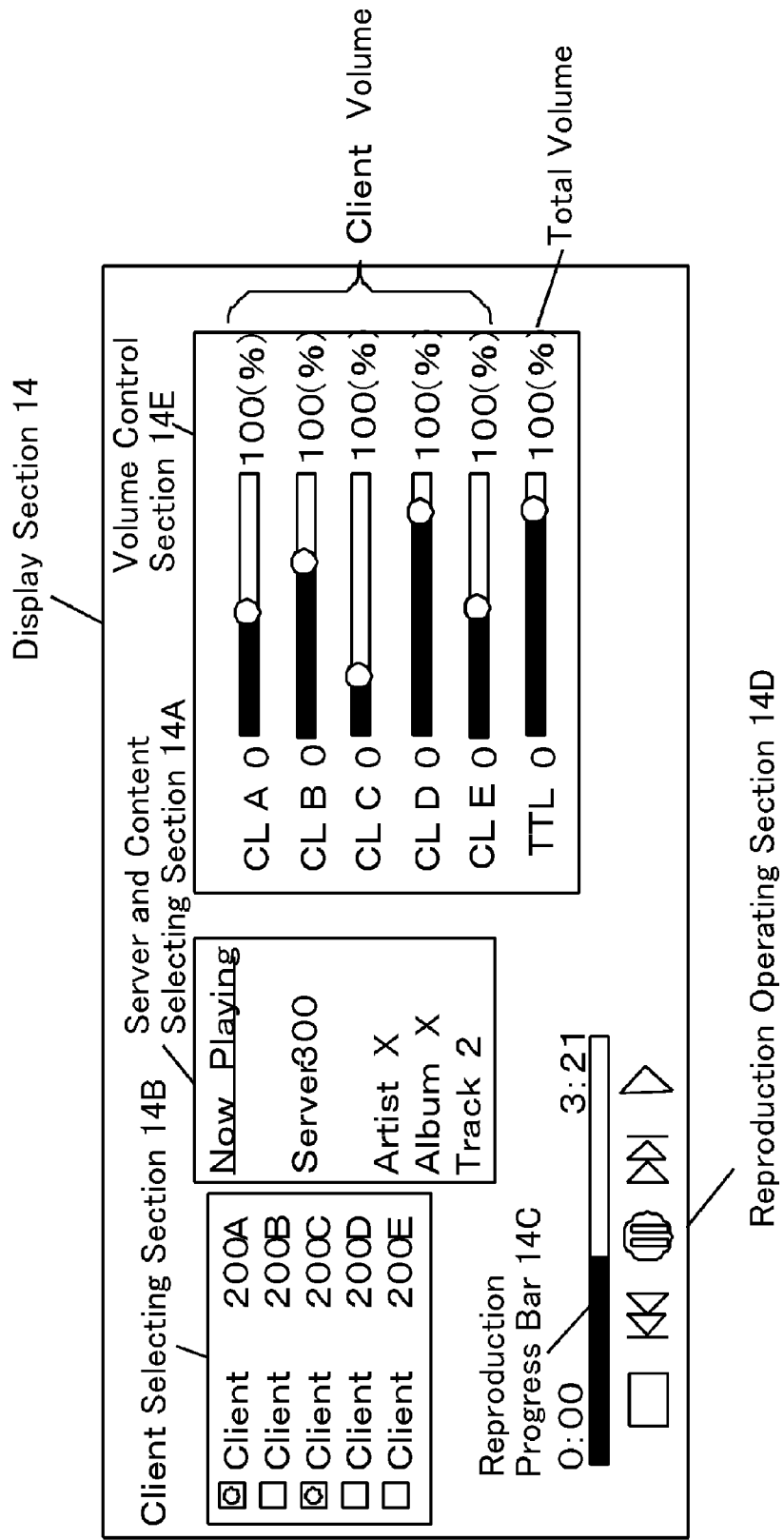
FIG. 3 illustrates a screen displayed on a display section of the controller.

The display section 14 is composed of information about the server 300, a contents list obtained from the server 300, a list of the clients 200, a contents reproducing state of the client 200, or a menu for controlling the client 200. FIG. 3 illustrates the display section 14 of the controller 100. The server and a contents selecting section 14A display information about the server 300 connected to the network and a contents list obtained from the server 300. The controller 100 makes the client 200 reproduce the contents selected by the user via the server and the contents selecting section 14A.

A client selecting section 14B of the display section 14 shows an interface for selecting the client 200 for reproducing the contents in the server 300. In this embodiment, the clients 200A to 200E are displayed on the client selecting section 14B. When a check is made in a frame displayed on a left end of the client selecting section 14B by a user's operation, the contents are reproduced from the client 200 with the check. Further, the client 200 recognized by the controller 100 is displayed on the client selecting section 14B, and when the client 200 is powered off, display of the powered-off client 200 may be deleted or the powered-off client 200 may be disabled to be selected.

A reproduction progress bar 14C of the display section 14 indicates a contents reproducing state of the client 200. In this embodiment, since it is assumed that the respective clients 200 reproduce the same contents at the same timing, only one reproduction progress bar is displayed. A reproduction operating section 14D of the display section 14 is an interface for transmitting instructions such as start of reproduction, stop of reproduction, skip-up and skip-down of contents, and pause of reproduction to the client 200.

A volume control section 14E of the display section 14 is an interface for changing the volumes of the respective clients 200. CL of the volume control section 14E stands for a client, and TTL stands for total. The respective bars indicate volume parameters, and a position of a knob indicated by a circle mark shows a current volume. The volumes of the clients 200 in the volume control section 14E (hereinafter, referred to client volumes) and the volume managed by the controller 100 (hereinafter, referred to total volumes) are 0 to 100, and the unit is %. That is to say, even when the largest volumes of the clients are different, the client volumes are uniformly a percentage with respect to 100 according to a method, described later. The volumes of the clients 200 can be adjusted by holding portions indicated by the circle marks of the volume bars CL A to CL E and moving to a left-right direction. Further, the volumes of the plurality of clients 200 can be changed simultaneously by operating a total volume bar. When the total volume is changed, only the volume value of the client 200 selected in the client selecting section 14B may be changed.

A communication section 15 of the controller 100 communicates with the client 200 or the server 300, and is an ethernet (registered trade name, hereinafter, referred to as ethernet) terminal or the like. The control section 11 of the controller 100 transmits/receives control commands to/from the client 200 and the server 300 via the communication section 15.

A control section 21 of the client 200 executes a program stored in a memory 22 so as to entirely control the client 200, and is, for example, a microcomputer or a CPU. The memory 22 retains setting contents of the client 200, and is, for example, a ROM or a RAM. The memory 22 has a volume table 201, described later.

An operating section 23 of the client 200 is an interface for adjusting the volume of the client 200, and is, for example, a knob for volume adjustment. A display section 24 displays information about contents being reproduced in the client 200 and a volume value set in the client 200. A communication section 25 transmits/receives control commands to/from the controller 100, and receives contents data or the like from the server 300. An audio processing section 26 is a DAC or a DSP, and executes a sound field process on sound data transmitted from the server 300 via the communication section 25 so as to make digital/analog conversion. The analog-converted sound data is amplified by an amplifying section 27, and is output to a speaker or the like. Further, the amplifying section 27 changes an amplification degree of an audio signal into an output level specified by an instruction of the control section 21.

A control section 31 of the server 300 executes a program stored in a memory 32 so as to entirely control the server 300, and is, for example, a microcomputer or a CPU. The memory 32 retains setting contents of the server 300, and is, for example, a ROM or a RAM. An HDD 33 is a hard disc drive, and stores music data and video data and the like, therein. A communication section 34 transmits/receives commands to/from the controller 100 or the client 200. For example, the communication section 34 transmits a contents list in the HDD 33 according to an instruction from the controller 100, and transmits contents data to the client 200 according to an instruction from the client 200.

The control section 11 of the controller 100 having the above constitution obtains variables for displaying the client volumes and the total volume on the volume control section 14E of the display section 14 from the client 200, and calculates the total volume and the client volumes. When the client volume bars are operated, the volumes set in the clients 200 are calculated, and a control command is transmitted. When the total volume is changed, the control section 11 calculates the volume values so that changes in output levels of the clients 200 are constant, and transmits the control command to the clients 200. Further, the client 200 has time information at a time of changing the volume (hereinafter, referred to as time stamp). The control section 11 obtains the volume information about the client 200 and time stamps related to the volume information at a time of activating the controller 100, and adjusts the total volume using the volume information of the client 200 with the latest time stamp so as to set the volume of the client 200.

Figure 4:
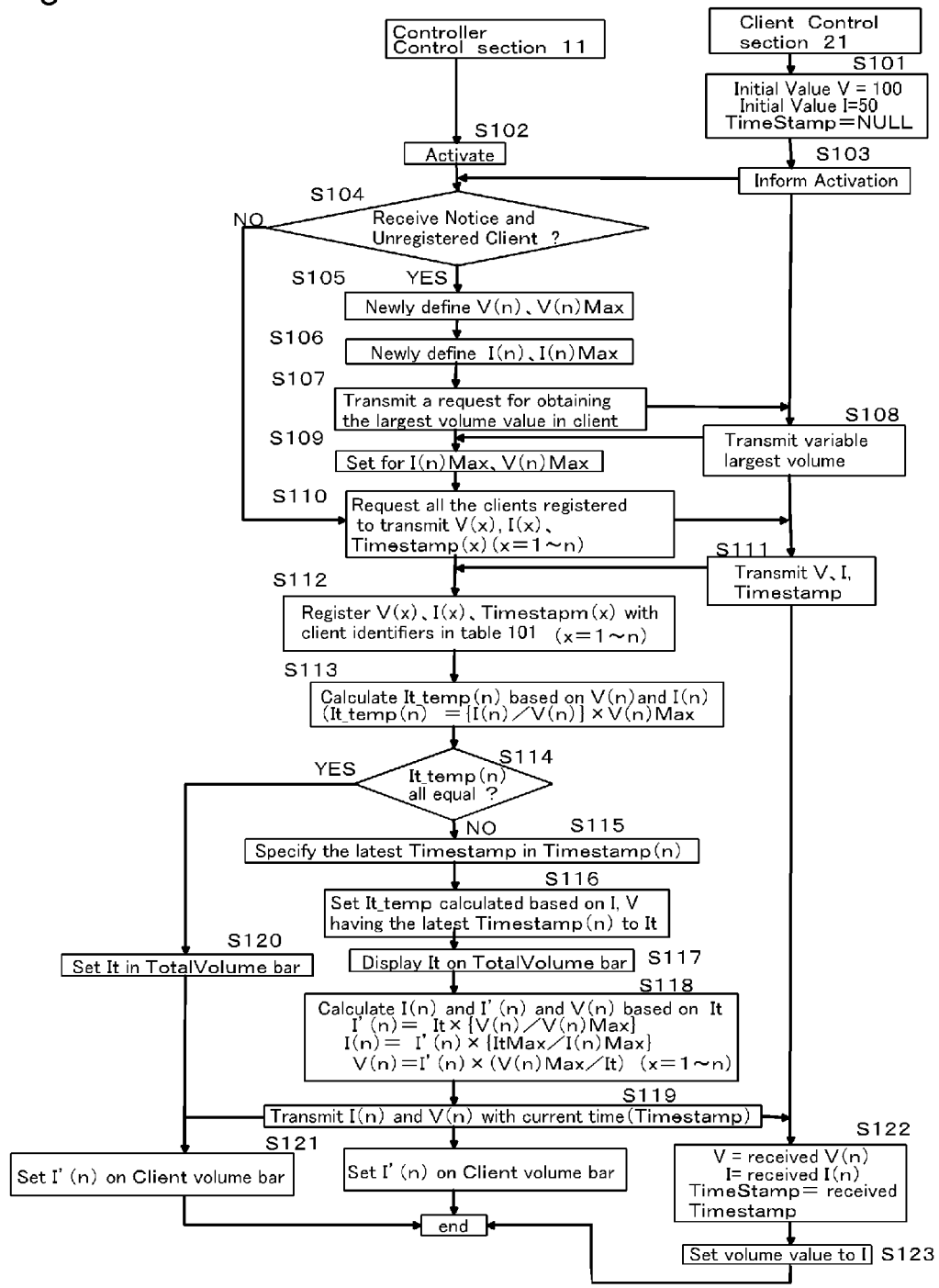
FIG. 4 is a sequence chart of the controller and the client.

FIG. 4 is a sequence chart illustrating the control section 11 of the controller 100 and the control section 21 of the client 200 at the time of activating the controller 100. When the controller 100 is activated, the control section 11 of the controller 100 obtains the variables for displaying the total volume and the client volumes of the clients 200 on the volume control section 14E (hereinafter, referred to as volume variable) from the clients 200. When the total volumes calculated based on the volume variables obtained from the clients 200 are different, the control section 11 determines the total volume based on the volume variables related with the latest time stamp. Further, the control section 11 transmits the volume variables calculated based on the determined total volume to the clients 200, so as to carry out updating into a state that consistency between the volume variables stored in the clients 200 and the volume variables of the controller is maintained.

The control section 21 of the client 200 has variables I (first parameter), V (the predetermined upper limit volume values: second parameter), and Timestamps. The variable I is a volume variable representing the volume set in the client 200. The variable V is the volume variable representing the value set in the client volume bar when the total volume is set to 100% on the volume control section 14E. An initial value of the variable V of the client 200 is 100, and an initial value of the variable I is 50, and the variable Timestamp is a NULL (ineffective value) (S101), but not limited to them, and may be any values.

The control section 11 of the controller 100 activates the controller 100 (S102). When the client 200 is activated, the control section 21 of the client 200 informs the activation of the client 200 to the controller 100 (S103).

When the control section 11 of the controller 100 receives the activation notice from the client 200, the client 200 that transmits the activation notice determines whether the client 200 is unregistered in the volume management table 101 of the controller 100 (S104). FIG. 5 illustrates the volume management table 101 of the controller 100. In the volume management table 101, IP addresses of the clients 200, the variables V, VMax, I, IMax, and Timestamp are related with MAC addresses of the clients 200 as client identifiers so as to be managed. Further, the variables It and ItMax to be used by the controller 100 are managed. The variables VMax and IMax (third parameters) are defined separately for description, but actually they may be the same variable. Additional characters (n) of the variables V, VMax, I and IMax are serial numbers for uniquely specifying the clients 200, and for example, n of the No. 1 client (the client 200A) in the volume management table 101 is 1. The MAC addresses and the IP addresses in the volume management table 101 are values included in the activation notice at S103. The variables V, VMax, I, IMax, and Timestamp are set by a process, described later.

When the control section 11 of the controller 100 receives the activation notice and the MAC address is not registered in the volume management table 101, the control section 11 determines as the unregistered client 200 (YES at S104). The control section 11 newly defines the volume variables V and VMax of the client 200 (S105), and adds them to the volume management table 101 in FIG. 5. For example, when the client 200E transmits the activation notice, a row No. 5 in the volume management table 101 is added, and V(5) and VMax (5) are defined. n that is newly defined is a value obtained by incrementing the variable n allocated to the registered client 200 by 1. The control section 11 defines the variables I(n) and I(n)Max, and adds them to the volume management table 101 in FIG. 5 (S106). IMax and VMax are largest values of I and V, respectively, and are set by a process, described later. I(n)Max and V(n)Max may be prescribed values (for example, 100). V(n) and I(n) satisfy the following formulas.

$$0 <= V(n) <= V(n)\text{Max} \quad (1)$$

$$0 <= I(n) <= I(n)\text{Max} \quad (2)$$

Figure 14:
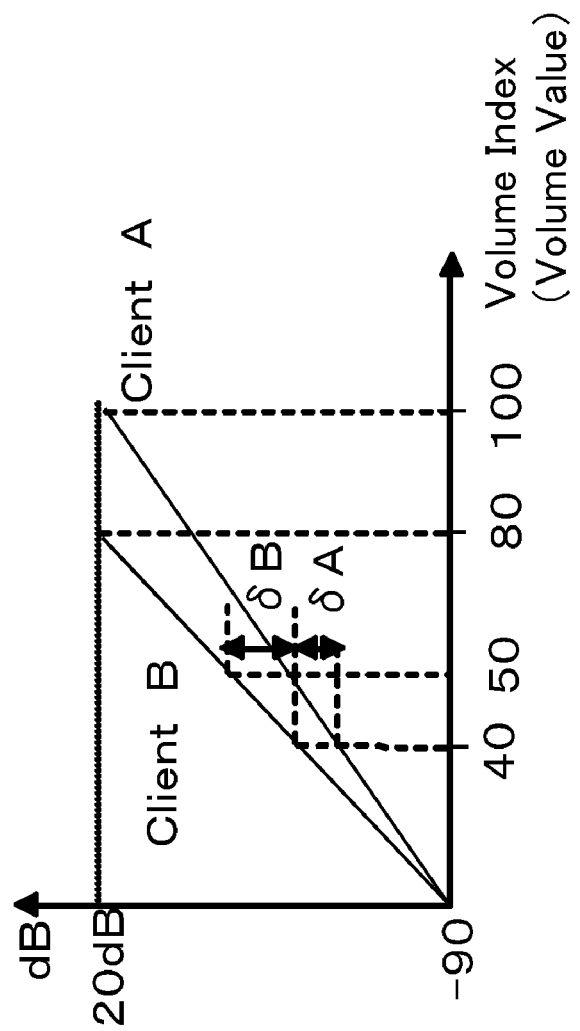
FIG. 14 illustrates output characteristics of the client.

The control section 11 transmits a request for obtaining the largest volume value settable in the client 200 to the client 200 in order to obtain I(n)Max and V(n)Max (S107). The largest volume value settable in the client 200 is a largest value on a horizontal axis in FIG. 14.

The control section 21 of the client transmits the largest volume value (S108), and the control section 11 of the controller 100 sets the received largest volume value for I(n)Max and V(n)Max (S109).

The control section 11 of the controller 100 requests all the clients 200 registered in the volume management table 101 to transmit the variables V, I, and Timestamp (S110), and the control sections 21 of the clients 200 transmit the values V, I and Timestamp retained by themselves to the controller 100 (S111). FIG. 6 illustrates the volume table 201 of each of the clients 200. The client 200 has the variables I, V, IMax and VMax. When the volume value is changed by operating the operating section 23 of the client 200 or the command for changing the volume value is received from the controller 100, the variables I and V are rewritten. IMax and VMax are fixed values. As described at S101, in this embodiment, the initial value of the variable V is 100, and the initial value of I is 50.

The control section 11 of the controller 100 updates the variables V(n), I(n) and Timestamp(n) in the volume management table 101 into the received values (S112).

The control section 11 calculates variables It_temp(n) of the respective clients 200 based on the obtained variables V(n) and I(n) (S113). It_temp represents a value of the total volume. The variable It_temp is a temporary variable for determining the total volume It of the controller 100. It_temp is calculated based on V and I of the respective clients 200 according to the following formulas. n in the following formulas represents a number in the volume management table in FIG. 5, and is a numerical value from 1 to the number of the clients.

$$\text{It\_temp}(n) = \{I(n)/V(n)\} \times V(n)\text{Max} \quad (3)$$

$$\text{however, } 0 <= I(n) <= \text{It\_temp}(n) <= \text{ItMax} \quad (4)$$

ItMax in the formula (4) is the largest value of the total volume of the volume control section 14E. In this embodiment, ItMax is 100. The control section 11 determines whether the calculated values It_temp(n) are equal to each other in all the clients 200 (S114). When determined as equal, a determination is made that consistency is obtained between the variables of all the clients 200. For this reason, the variable It=It_temp, and It is set to the total volume of the display section 14 (S120). That is to say, the control section 11 moves a position of the knob of the total volume bar of the volume control section 14E to the value It. It also satisfies the following formula (5) similarly to It_temp.

$$0 <= I(n) <= \text{It} <= \text{ItMax} \quad (5)$$

Positions of the knobs on the client volume bars of the volume control section 14E are set to I'(n) calculated by a process at 5118, described later (S121). I' represents the position of the knob of the client volume of the volume control section 14E. That is to say, I' is a variable representing the position on display of the client volume bar. The total volume is a value representing a percentage of I'(n) to V(n).

When the control section 11 determines that It_temp(n) varies according to the respective clients 200 (NO at S114), Timestamp representing the latest time in the variables Timestamp(n) is specified (S115). In a case of the volume management table 101 in FIG. 5, the determination is made that Timestamp of the client 200A is the latest.

The control section 11 sets It_temp(n) calculated based on the variables I(n) and V(n) of the client 200 having the latest Timestamp(n) to It (S116). In the case of the volume management table 101 in FIG. 5, It_temp(1) calculated based on the values I(1) and V(1) is It. The control section 11 sets It in the total volume similarly to S120 (S117).

The control section 11 calculates I'(n), I(n) and V(n) of the respective clients 200 based on It defined by the process at S117. I, I' and V of the respective clients 200 are derived from the following procedure.

In the formula (3), when It_temp is It and I(n) is I'(n), the following formula holds.

$$I'(n) = \text{It} \times \{V(n)/V(n)\text{Max}\} \quad (6)$$

$$\text{however, } 0 <= I'(n) <= \text{It} <= \text{ItMax} \quad (7)$$

For example, when It=80%, V(1)Max=90 and V(1)=60, I'(1)=80×{60/90}. For this reason, the display position I'(1) is approximately 53.3%.

I(n) as the volume value of the controller 100 set in the client 200 is expressed by using I'(n) according to the following formula.

$$I(n) = I'(n) \times \{\text{ItMax}/I(n)\text{Max}\} \quad (8)$$

In the formula (8), when I(n)Max is equal to ItMax (for example, both I(n)Max and ItMax are 100), I'(n)=I(n). In the case of the client 200A, I(1)=I'(n)×100/90. For this reason, the volume value obtained by multiplying I'(n) displayed on the client volume bar of the client 200A by about 1.11 is set in the client 200A. That is to say, the volume value I(n) set in the client 200 is a value obtained by correcting the display value I'(n) using ItMax and I(n)Max. As a result, when the total volume is changed, the volume values I(n) can be determined so that the output characteristics of the clients become constant. Further, the formula (6) is deformed, and V(n) is expressed by the following formula.

$$V(n)=I'(n)\times(V(n)\text{Max}/\text{It}) \quad (9)$$

With return to the flowchart in FIG. 4, the control section 11 of the controller 100 calculates I(n) and V(n) in all the clients 200 according to the formulas (8) and (9), and transmits them together with Timestamp in which the current time is set to the respective clients 200 (S119).

The control section 21 of the client 200 stores V and I received from the controller 100 in V and I of the volume table 201 in FIG. 6, and updates Timestamp to the received value (S122).

The control sections 21 of the clients 200 set the output levels related to I set by the process at S122 in the amplifying sections 27 of the clients 200, respectively, and control the volumes (S123).

As a result of the above process, when the controller 100 is activated, the control section 11 of the controller 100 obtains the volume variables stored in the clients 200, and calculates It so as to display the total volume. The control section 11 calculates I'(n) based on It, and displays the client volumes. Since the total volume (It) is displayed as percentages of the volume values (I(n)) set in the clients 200 with respect to the largest settable values (V(n)), the user can obtain the volume values set in the clients 200 only by checking the total volume. Further, when the variables It calculated based on the volume variables of the clients 200 are not equal to each other, the volume variables of the clients 200 are calculated based on It calculated based on the volume variable of the client 200 having the latest timestamp. The controller 100 changes the output levels of the clients 200, and allows the clients 200 to update the volume variables (I(n), and V(n)) and the time stamps. As a result, the consistency between the volume variables of the clients 200 and the controller 100 in the network is maintained.

Figure 7:
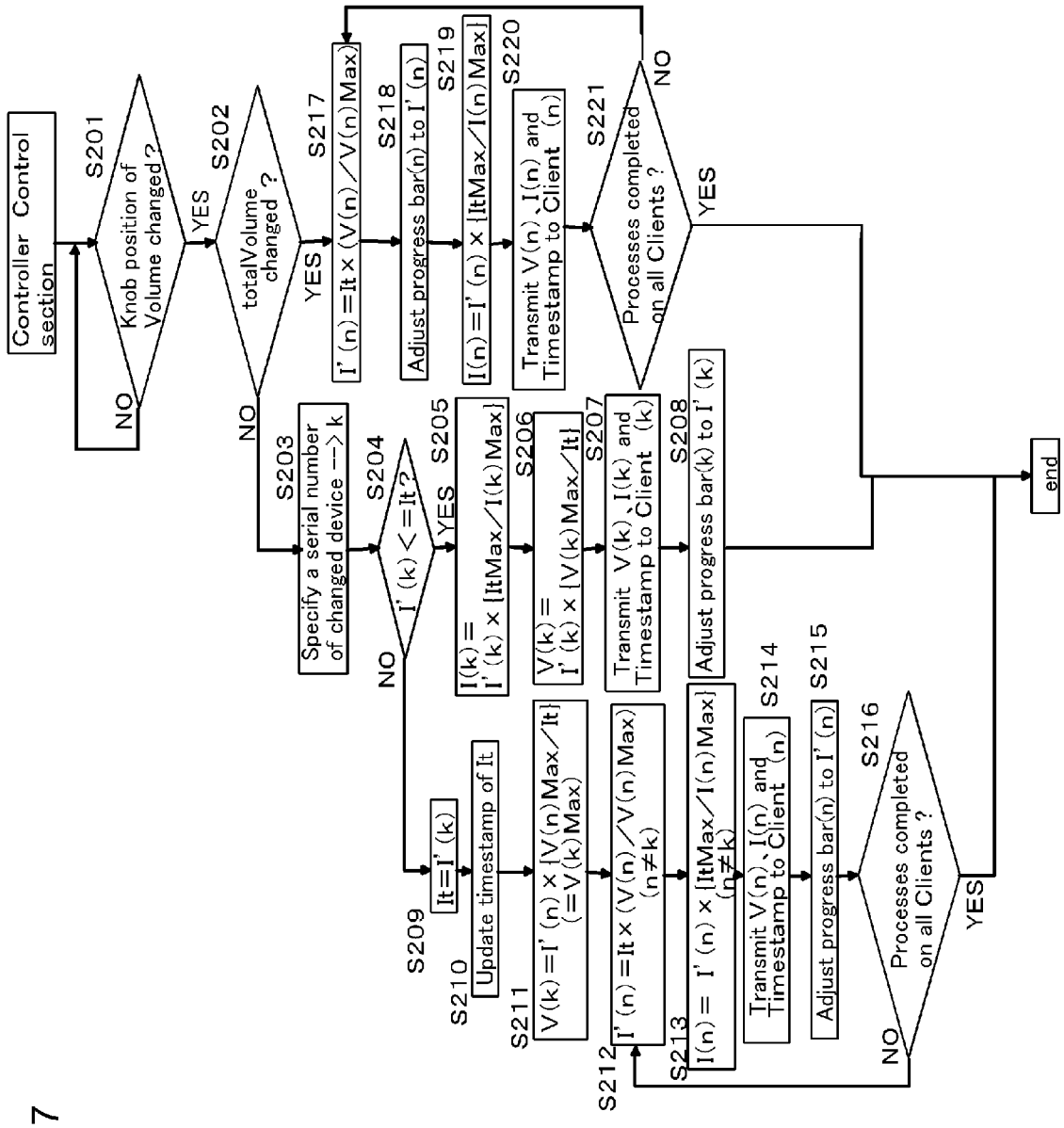
FIG. 7 is a flowchart to be executed by the controller.

FIG. 7 is a flowchart executed by the control section 11 of the controller 100 when the knob on the volume control section 14E of the display section 14 of the controller 100 is operated.

The control section 11 of the controller 100 determines whether the knob on the volume control section 14E is operated (S201). When the determination is made that the volume is not changed, the process waits for a change (NO at S201). When the control section 11 determines that the volume is changed (YES at S201), it determines whether the total volume of the volume control section 14E is changed (S202).

When the determination is made that any client volume is operated (NO at S202), the operated client volume is specified (S203). For example, when the determination is made that the volume of CL C (the client 200C) in the volume control section 14E is changed, a serial number k is specified as 3.

The control section 11 determines whether I'(k) is It or less. As described above, I'(k) is a display value of the client volume bar. According to the formula (7), since I'(k) is subject to be It or less, the control section 11 determines whether the changed client volume I'(k) is the total volume It or less (S204).

When the control section 11 determines that I'(k) is It or less (YES at S204), it calculates I(k) as the volume value to be set in the client 200 according to the formula (8) (S205). The control section 11 calculates V(k) according to the formula (9) (S206). At S205 and S206, only I(k) and V(k) of the clients 200 whose volume value is changed are calculated, but I(n) and V(n) of the non-operated clients 200 are not calculated.

The control section 11 transmits the calculated V(k), the changed I(k) and the current time as the set timestamp to the client 200 whose volume value is changed (S207). The client 200 that receives these variables executes the processes at S122 and S123 in FIG. 4. The control section 11 updates the display position of the knob of the client volume to the position indicated by I'(k) (S208), and ends the process. The client volumes of other than the client 200 shown by the serial number k are not changed. The values of the time stamps may be transmitted to the clients 200 and may be updated.

When the control section 11 determines that I(k) is larger than It (NO at S204), the formula (7) should be satisfied. For this reason, I'(k) is assigned to It (S209). The control section 11 updates the time stamp of It to a current time (S210).

The control section 11 calculates V(k) according to the formula (9) (S211). Since I'(n) is equal to It due to the process at S209, I'(n)/It is 1, and V(k)=V(k)Max holds.

The control section 11 calculates I(n) of the client volume of the client 200 whose client volume is not changed according to the following process, and transmits V, I and Timestamps to the respective clients. The control section 11 calculates I'(n) according to the formula (6) (S212), and calculates I(n) using the calculated I'(n) according to the formula (8) (S213). n at S212 and S213 is a variable from 1 to the number of clients excluding k.

The control section 11 transmits V(n), I(n) and the Timestamp values in which current times are registered to all the clients 200 (S214). The control section 11 updates the values of the client volume bars to I'(n) (S215). That is to say, when the client volume value I'(k) of a certain client 200 is adjusted to exceed It, the values of the client volume bars of all the client 200 are updated, and the clients 200 are made to change the volume values. The control section 11 determines whether the processes at S212 to S215 are executed on all the clients 200. When the determination is made as uncompleted (NO at S216), the processes after S212 are executed while the value n is being changed. When the determination is made that all the processes are completed (YES at S216), the processes are ended.

When the control section 11 determines that the total volume of the display section 14 is changed (YES at S202), the control section 11 calculates I'(n) showing the display position of the client volume bar according to the formula (6) (S217). n is a variable representing 1 to the number of the clients. The control section 11 sets I'(n) on the client volume bar (S218), and calculates I(n) according to the formula (8) (S219).

The control section 11 transmits calculated I(n), V(n), and Timestamp in which a current time is stored to the clients 200 (S220). Since V(n) is not changed, the control section 11 does not have to make the calculation and transmits V(n) in the volume table 201 directly. The control section 11 does not have to transmit V(n).

The control section 11 determines whether the processes at S217 to S220 are executed on all the client 200 (S221). When the determination is made as uncompleted (NO at S221), the processes after S217 are executed while the value n is being changed. When the determination is made that all the processes are completed (YES at S221), the processes are ended.

The process in FIG. 7 is concretely described with reference to FIGS. 8 to 12. FIGS. 8 to 12 illustrate V, I, I', It and volume bars at a time when the client volume of the client 200A or the total volume is operated. For simple description, ItMax=100, I(n)Max=100, and V(n)Ma x=100.

Figure 8:
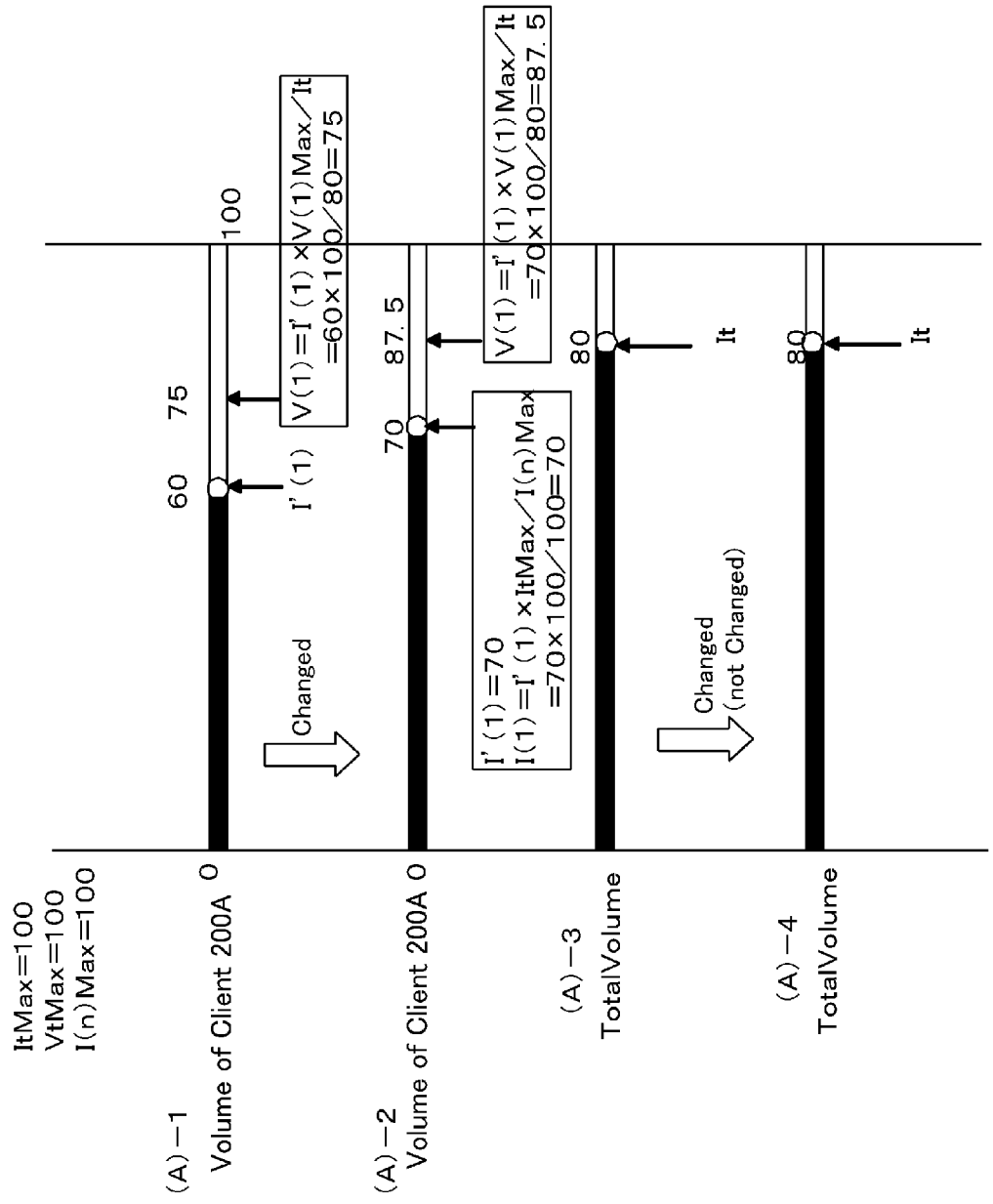
FIG. 8 illustrates volume control in the controller.

FIG. 8 illustrates I(1), I'(1), V(1) and It of the client 200A at a time when the client volume I'(1) of the client 200A in the volume control section 14E is changed within a range of not more than It, and corresponds to a case where the determination is made as YES at S204 in FIGS. 7. (A)-1 and (A)-2 in FIG. 8 illustrate the client volumes of the client 200A before and after the change. (A)-3 and (A)-4 in FIG. 8 illustrate the total volume bars before and after the client volume is changed.

In (A)-1 of FIG. 8, the client volume is such that I'(1)=60 and V(1)=75. V(1) is calculated according to the formula (9).

A user operation changes the client volume I'(1) from 60 into 70 ((A)-2 of FIG. 8). The control section 11 calculates I(1) according to the process at S205 (I(1)=70). Further, the control section 11 calculates V(1) according to the process at S206 (V(1)=87.5). The control section 11 updates the client volume bar into changed I'(1)=70 (S208).

The total volume in a state of (A)-3 is changed into a state of (A)-4. That is to say, in this embodiment, It is not changed. When the client volume value is changed into a value not more than It, the total volume bar is not changed. The value of It represents the percentage of I' with respect to V on the client volume bar. The percentage (It) of the client volume 200A before the change is such that (60/75)×100=80, and the percentage (It) of the client volume 200A after the change is such that (70/87.5)×100=80. That is to say, V is changed so that the percentage of I' with respect to V of the client 200A before the change is equal to that after the change. As a result, the user checks the position of the total volume, so as to be capable of understanding the positions indicating the percentage of the client volumes of the clients 200 with respect to the settable volume values.

Figure 9:
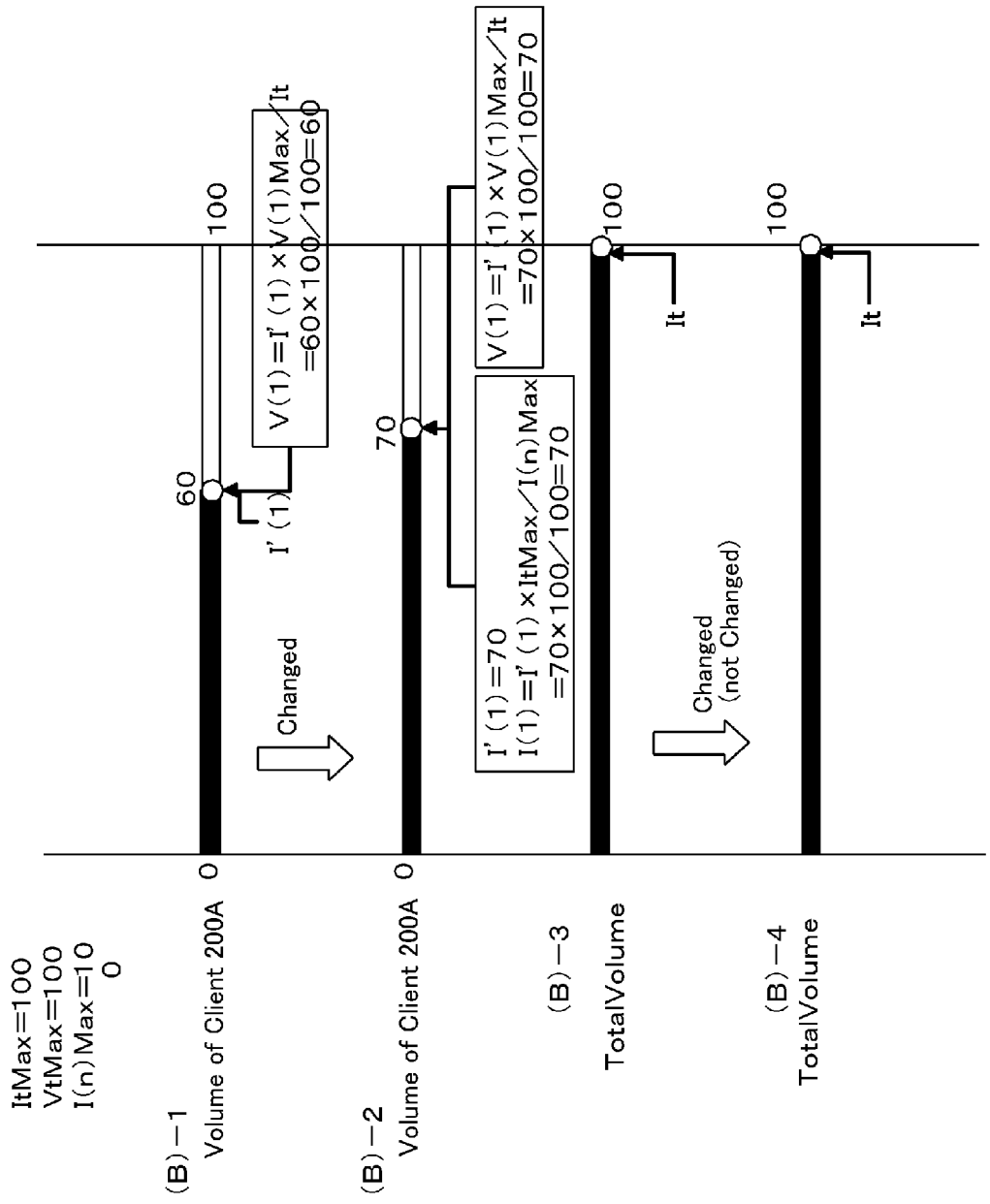
FIG. 9 illustrates volume control in the controller.

FIG. 9 also illustrates the states of the volume bars at a time when the determination is made as YES at S204 in FIG. 7. FIG. 9 illustrates the embodiment when the client volume I'(1) of the client 200A in the volume control section 14E is not more than It, and the total volume It is 100.

In (B)-1 of FIG. 9, the client volume is such that I'(1)=60 and V(1)=60. That is to say, since It is already 100%, the percentage of I'(1) with respect to V(1) is 100%.

A user operation changes the client volume I'(1) from 60 into 70 ((B)-2 in FIG. 9). The control section 11 calculates I(1) according to the process at S205 (I(1)=70). Further, the control section 11 calculates V(1) according to the process at S206 (V(1)=70). The control section 11 updates the client volume bar into changed I'(1)=70 (S208). That is to say, since the ratio of I'(1) to V(1) should be 1, I'(1) and V(1) have the same value. In FIG. 9, the total volume It does not change.

Figure 10:
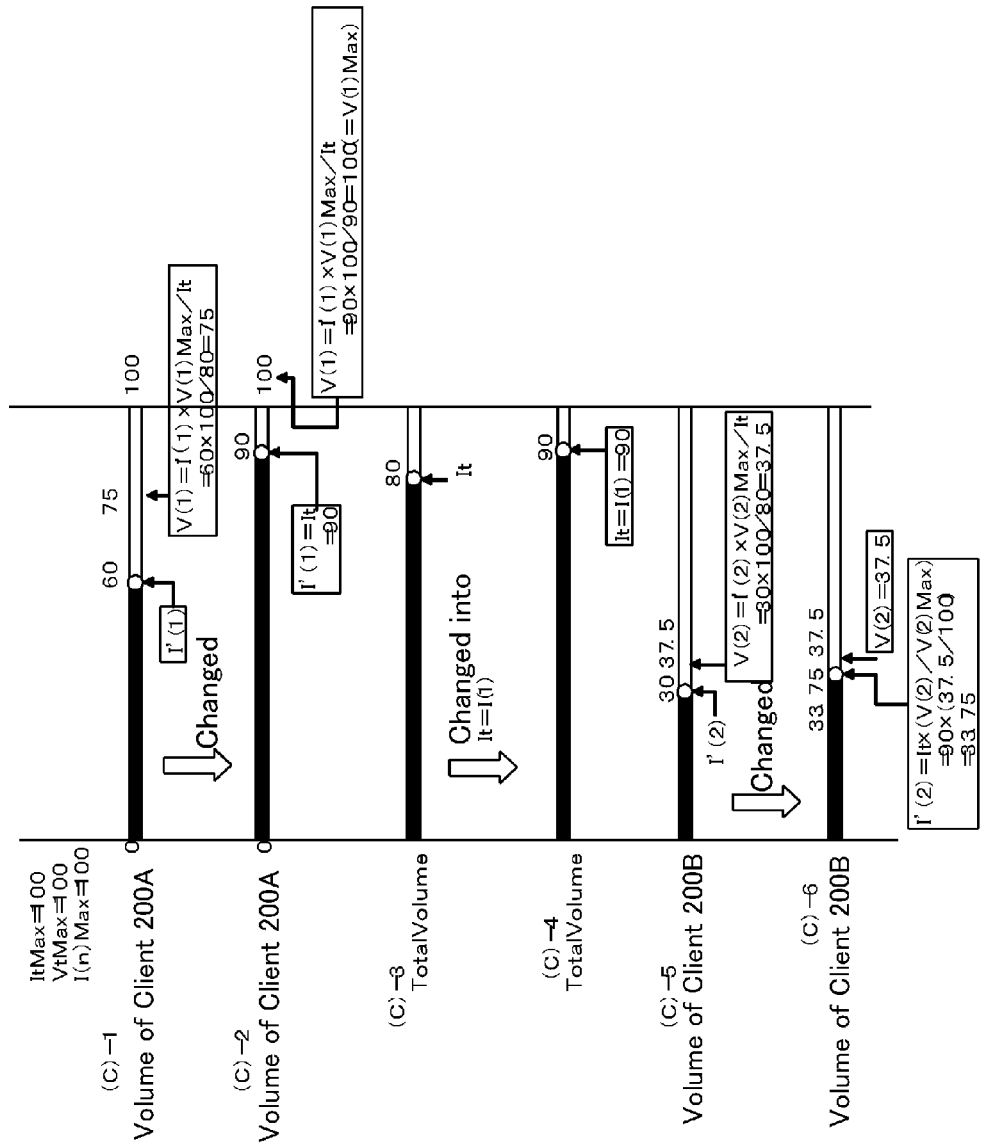
FIG. 10 illustrates volume control in the controller.

FIG. 10 illustrates an embodiment at a time when the determination is made as NO at S204 in FIG. 7. That is to say, FIG. 10 illustrates a state that the client volume I'(1) of the client 200A in the volume control section 14E is changed into a range larger than It. (C)-5 and (C)-6 in FIG. 10 illustrate the client volume bars of the client 200B before and after the volume value of the client 200A is changed.

In (C)-1 of FIG. 10, the client volume of the client 200A is such that I'(1)=60 and V(1)=75. A user operation changes the client volume I'(1) from 60 into 90 ((C)-2 in FIG. 10). The control section 11 changes It into the value (90) of I'(1) (S209), and the control section 11 calculates V(1) according to the process at S211 (V(1)=100=V(1)Max). At this time, V(1)=V(1)Max holds. When V(1) is equal to V(1)Max, It obtains a value equal to I(1)/V(1), and thus when the total volume is operated, the client volume of the client 200A has the same value as that of the total volume.

The client volume of the client 200B is changed in conjunction with the change in the client volume of the client 200A. The volume variable of the client 200B before the change is such that I'(2)=30 and V(2)=37.5 as shown in (C)-5. The client volume of the client 200B is calculated such that I'(2)=33.75 according to the calculation at S212. Further, the control section 11 calculates I(2) at S213 so as to transmit I(2) to the client 200B (S214). Since I(2)Max is 100, I'(2)=I(2) =33.75. That is to say, the knob position of the client volume bar of the client 200B with respect to V(2) is changed from the position of 30/37.5×100=80% into the position of 33.75/37.5=90%. According to the change in the client volume of the client 200A, the client volume of the client B is also suitably adjusted. The similar process is executed on the clients 200C, 200D and 200E.

Figure 11:
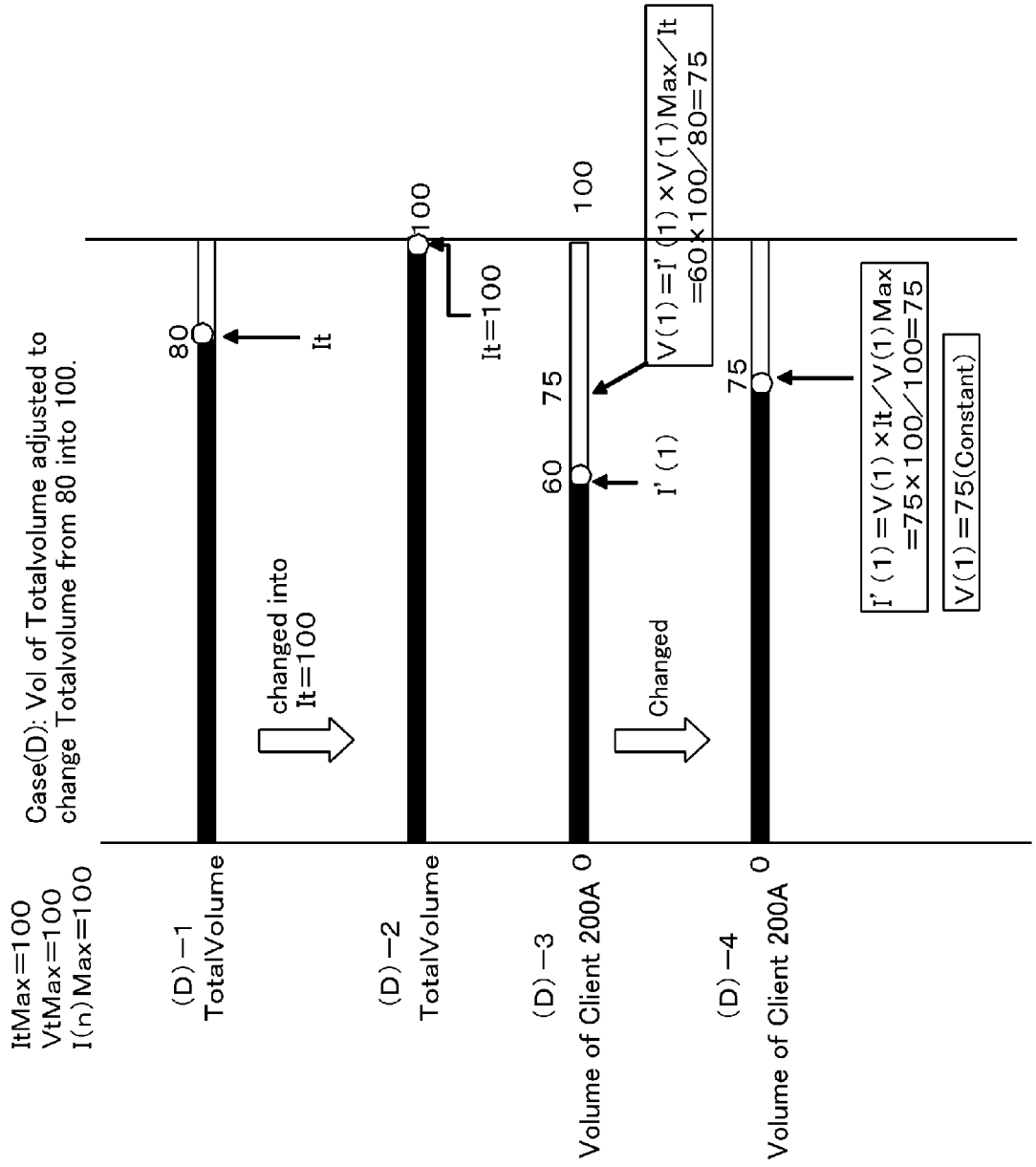
FIG. 11 illustrates volume control in the controller.

FIG. 11 illustrates an embodiment at a time when the determination is made as YES at S202 in FIG. 7. That is to say, FIG. 11 illustrates a state that the total volume It in the volume control section 14E is changed. (D)-1 and (D)-2 in FIGS. 11 illustrate states of the total volume before and after the change, and (D)-3 and (D)-4 illustrate the client volume of the client 200A before the total volume is changed and the client volume of the client 200A after the total volume is changed.

In (D)-1 of FIG. 11, the total volume It is 80, and the user operation changes the total volume It into 100 ((D)-2). I(1) and V(1) of the client 200A before the total volume is changed are 60 and 75, respectively ((D)-3). When the total volume is changed, I'(1) of the client 200A is calculated as 75 according to the process at S217. The control section 11 calculates I(1) according to the process at S219, and sets I(1) in the client 200A (S220). When the total volume becomes 100%, the ratio of I'(1) to the variable V(1) of the client volume is 1. When the total volume is changed, V(1) of the client 200A does not change. The clients 200B to 200E are also processed similarly. When the total volume is changed by the above process, V and I are changed so that the percentage of V and I of the client volume is equal to the total volume.

Figure 12:
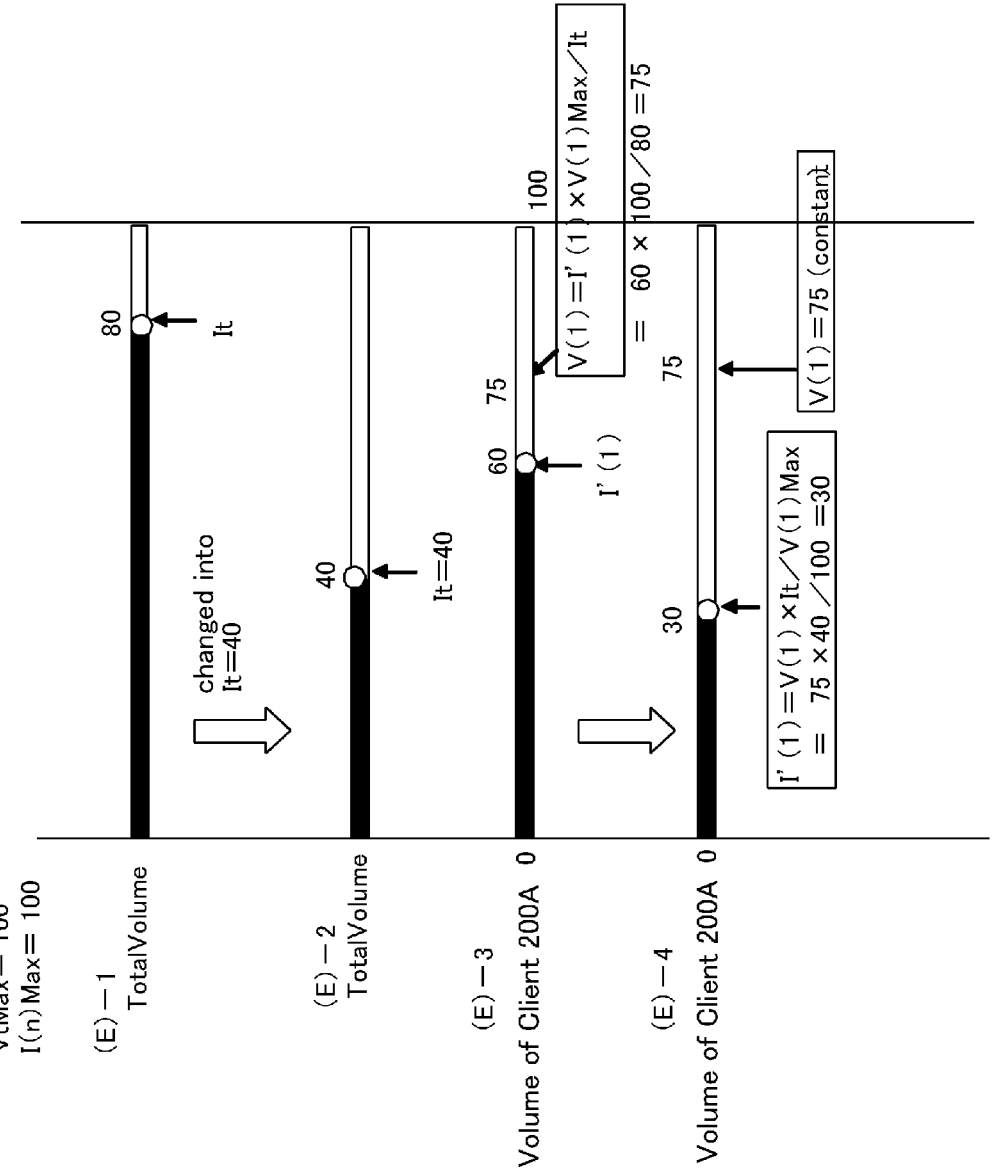
FIG. 12 illustrates volume control in the controller.

FIG. 12 also illustrates an embodiment at a time when the determination is made as YES at S202 in FIG. 7. FIG. 12 illustrates a state that the total volume It in the volume control section 14E is changed so as to be decreased. (E)-1 and (E)-2 of FIG. 12 illustrate states of the total volume before and after the change, (E)-3, and (E)-4 illustrate the client volume of the client 200A before the total volume is changed and the client volume of the client 200A after the total volume is changed.

In (E)-1 of FIG. 12, the total volume It is 80, the user operation changes the total volume It into 40 ((E)-2). I(1) and V(1) of the client 200A before the total volume is changed are 60 and 75, respectively ((E)-3). When the total volume is changed, the control section 11 calculates I'(1) of the client 200A as 30 according to the process at S217. The control section 11 calculates I(1) according to the process at S219, and sets I(1) in the client 200A (S220). The clients 200B to 200E are also processed similarly. When the total volume is changed by the above process, V and I are changed so that the percentage of the client volume with respect to V and I becomes equal to the total volume.

Figure 13:
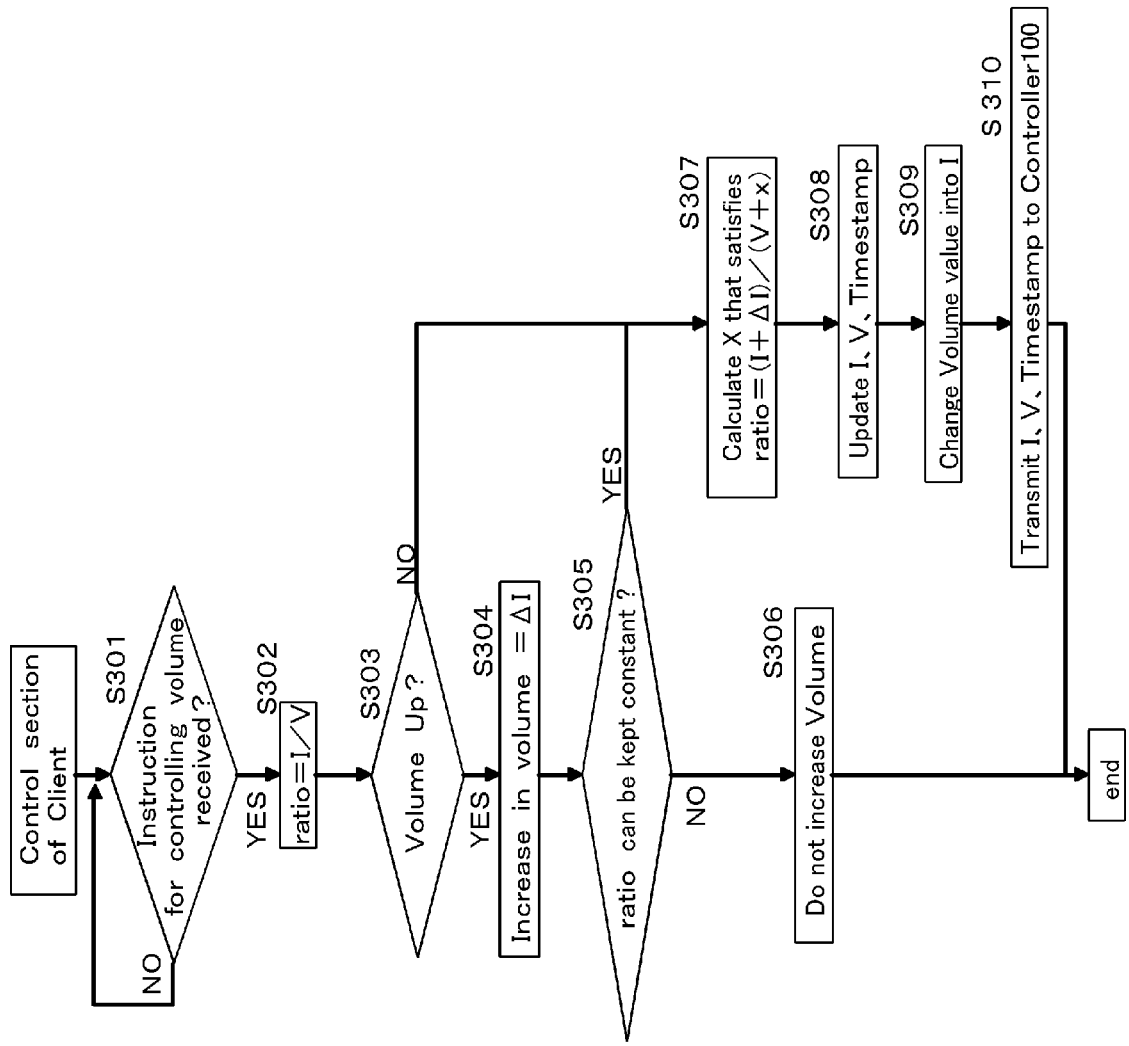
FIG. 13 is a flowchart to be executed by an audio output device.

FIG. 13 is a flowchart executed by the control section 11 of the client 200 when the volume value is changed by operating the operating section 23 of the client 200.

The control section 21 of the client 200 determines whether an instruction for controlling a volume is input by a user operation (S301), and when determined that the instruction for controlling the volume is not input (NO at S301), the sequence waits for the control instruction. When the instruction for controlling the volume is input (YES at S301), the control section 21 calculates a variable ratio=I/V based on I and V in the volume table 201. For example, in a case of the volume table 201 of FIG. 6, the ratio is 40/90.

The control section 21 determines whether an instruction for increasing the volume is received (S303), and when the determination is made as the instruction for increasing (YES at S303), a volume value for the increase is stored in ΔI (S304). The control section 21 determines whether the above ratio can be kept constant when I is changed into I+ΔI (S305). V' that satisfies (I+ΔI)/V' (V' is V after the change) is necessary in order to keep the ratio constant, but V should satisfy VMax or less. That is to say, the control section 11 determines whether V that is VMax or less enables the ratio to be kept constant. When V that can keep the ratio constant is not present, the total volume It that is calculated based on I+ΔI and V' exceeds a value of the variable It managed by the controller 100, and thus the consistency of It between the client 200 and the controller 100 cannot be obtained. Therefore, the control section 11 displays a message that the received volume value cannot be changed on the display section 24, and does not change the volume (S306).

When the determination is made as the instruction for decreasing the volume (NO at S303) or that the ratio can be kept constant (YES at S305), the control section 21 calculates x that satisfies ratio=(I+ΔI)/(V+x), updates V into V+x and updates I into I+ΔI in the volume table 201, and updates Timestamp into a current time (S308). The control section 21 changes the output level into a value calculated by I after the change (S309). The control section 21 transmits changed I, V and Timestamp to the controller 100 (S310). The controller 100 stores I, V and Timestamp transmitted from the client 200 into the volume management table 101, and updates the knob position of the client volume to the position of I' calculated according to the formula (6).

When the volume is changed by operating the client 200, the above process changes the volume within a range that does not exceed It managed by the controller 100, and thus the consistency between the total volume of the controller 100 and the client volume of the client 200 is maintained.

The above described is the preferred embodiments of the present invention, but the present invention is not limited to the embodiments. A plurality of the controllers 100 may be present. The server 300 may be provided in the client 200 or in the controller 100.

The controller of the present invention is suitably applied to PCs or mobile terminals and the like, and the client is suitably applied to devices such as AV receivers, AV amplifiers, and TVs.

What is claimed is:

1. A volume control system, comprising:
   a plurality of audio output devices capable of adjusting volumes; and
   a controller capable of controlling the audio output devices, wherein
   the controller has
      a display section for displaying information about the audio output devices,
      a first parameter obtaining section for obtaining first parameters representing non-normalized volume values set in the audio output devices from the audio output devices,
      a second parameter obtaining section for obtaining second parameters representing predetermined non-normalized upper limit volume values stored in the audio output devices from the audio output devices,
      a management section for relating the first parameters and the second parameters to the audio output devices so as to manage them,
      a total volume value determining section for determining values determined by ratios of the first parameters to the second parameters of the audio output devices as total volume values,
      an individual volume value determining section for determining values determined by multiplying the total volume values and percentages of the second parameters to prescribed values as individual volume values of the audio output devices,
      a total volume value display section for displaying the total volume values on the display section, and
      an individual display section for displaying the individual volume values of the audio output devices on the display section,
   each of the audio output devices has
      a parameter transmitting section for transmitting each of the first parameters and each of the second parameters to the controller, and
      a volume value storage section for storing each of the first parameters and each of the second parameters with them being related to each other.

2. The volume control system according to claim 1, wherein
   the controller further has
      a total volume value changing section for changing the total volume values via a user operation, and
      a volume control information transmitting section for transmitting information for changing volumes into the individual volume values to the audio output devices,
   when the total volume values are changed, the individual volume value determining section determines values that are determined by multiplying the changed total volume values and the percentages of the second parameters with respect to the prescribed values as the individual volume values, and the individual display section updates the individual volume values of the audio output devices so as to display them,
   each of the audio output devices further has,
      a volume control information receiving section for receiving each of the individual volume values from the controller, and
      a volume changing section for changing the volume of each of the audio output devices based on each of the received individual volume values.

3. The volume control system according to claim 2, wherein
   the controller further has a third parameter obtaining section for obtaining third parameters as largest volume values settable in the audio output devices,
   the total volume value determining section determines the total volume values using percentages of the second parameters with respect to the third parameters instead of the second parameters,
   the individual volume value determining section determines the individual volume values using the third parameters instead of the prescribed values,
   in each of the audio output devices
      the parameter transmitting section transmits each of the first parameters, each of the second parameters and each of the third parameters to the controller, the volume value storage section stores each of the first parameters, each of the second parameters and each of the third parameters with them being related to each other.

4. The volume control system according to claim 2, wherein the controller further has an audio output device volume value changing section for changing the individual volume values, a second parameter updating section for, when the individual volume values are changed, calculating to update the second parameters so that percentages of the changed individual volume values with respect to the second parameters are equal to the total volume values, a determining section for, when the individual volume values are changed, determining whether the changed individual volume values are larger than the total volume values, and a total volume value updating section for, when the determination is made that the changed individual volume values are larger than the total volume values, updating the total volume values to the changed individual volume values, the individual volume value determining section determines the individual volume values of the audio output devices whose individual volume values are not changed, the volume control information transmitting section transmits the individual volume values and the changed second parameters to the audio output devices, in each of the audio output devices, the volume value storage section updates each of the individual volume values transmitted by the volume control information transmitting section as each of the first parameters so as to store the updated value, and updates each of the transmitted second parameters so as to store the updated parameter.

5. The volume control system according to claim 2, wherein the volume control information transmitting section relates the individual volume values and the changed second parameters to time stamps representing current time so as to transmit them to the audio output devices, each of the audio output devices further has an updating section for, when the user operation changes the volume values of the audio output devices, updating each of the first parameters, each of the second parameters and each of the time stamps, the volume value storage section stores the first parameters, the second parameters and the time stamps with them being related to each other, the parameter transmitting section transmits each of the first parameters, each of the second parameters and each of the time stamps to the controller, the controller further has a time stamp obtaining section for obtaining the time stamps, and a total volume value determining section for determining whether all the total volume values determined based on the first parameters and the second parameters obtained from the audio output devices are equal to each other, when all the total volume values are not equal to each other, the total volume value determining section determines the total volume values based on the first parameters and the second parameters with the latest time stamps, and transmits the first parameters, the second parameters and the time stamps determined based on the total volume values to the volume output devices.

6. A non-transitory computer readable medium storing a controller program for allowing the controller to operate the respective sections of the controller in the volume control system according to claim 1.

7. The audio output devices in the volume control system according to claim 1.

* * * * *